(12) United States Patent
Zhao et al.

(10) Patent No.: US 11,942,904 B2
(45) Date of Patent: Mar. 26, 2024

(54) SYSTEMS AND METHODS FOR DIGITAL PREDISTORTION TO MITIGATE POWER AMPLIFIER BIAS CIRCUIT EFFECTS

(71) Applicant: Xilinx, Inc., San Jose, CA (US)

(72) Inventors: Hongzhi Zhao, Los Gatos, CA (US); Xing Zhao, San Ramon, CA (US); Vincent C. Barnes, El Paso, TX (US); Xiaohan Chen, Sunnyvale, CA (US); Hemang M. Parekh, San Jose, CA (US)

(73) Assignee: XILINX, INC., San Jose, CA (US)

( * ) Notice: Subject to any disclaimer, the term of this patent is extended or adjusted under 35 U.S.C. 154(b) by 165 days.

(21) Appl. No.: 17/402,892

(22) Filed: Aug. 16, 2021

(65) Prior Publication Data
US 2023/0046588 A1    Feb. 16, 2023

(51) Int. Cl.
H03F 1/32    (2006.01)
H03F 3/21    (2006.01)
H03G 1/00    (2006.01)

(52) U.S. Cl.
CPC ............ H03F 1/3247 (2013.01); H03F 3/21 (2013.01); H03G 1/0005 (2013.01); *H03F 2201/3227* (2013.01)

(58) Field of Classification Search
CPC .. H03F 1/3247; H03F 3/21; H03F 2201/3227; H03F 1/0288; H03F 1/3241; H03F 3/245; H03F 1/3252; H03G 1/0005

USPC ........................................................ 330/149
See application file for complete search history.

(56) References Cited

U.S. PATENT DOCUMENTS

| | | | |
|---|---|---|---|
| 8,837,633 B2 | 9/2014 | Dick | |
| 9,014,241 B2 | 4/2015 | Dick | |
| 9,337,886 B1 | 5/2016 | Dick | |
| 9,338,039 B1 | 5/2016 | Barnes | |
| 9,866,269 B1 | 1/2018 | Zhao et al. | |
| 10,411,656 B1 | 9/2019 | Dick et al. | |
| 10,715,702 B1 | 7/2020 | Zhao et al. | |
| 10,944,444 B2 | 3/2021 | Dick et al. | |
| 2005/0190857 A1* | 9/2005 | Braithwaite | H03F 1/3247 375/296 |
| 2012/0294387 A1* | 11/2012 | Ghannouchi | H03F 1/0288 375/295 |

* cited by examiner

*Primary Examiner* — Andrea Lindgren Baltzell
*Assistant Examiner* — Khiem D Nguyen
(74) *Attorney, Agent, or Firm* — Patterson + Sheridan, LLP (57) ABSTRACT

A digital predistortion (DPD) system includes an input configured to receive an input signal. In some examples, a first signal path configured to generate a first signal based on the input signal. In some examples, an error model provider configured to generate an error model signal modeled after a gate bias error voltage associated with the DPD system. In some examples, a first combiner configured to combine the first signal and the error model signal to generate a first intermediate signal, and the DPD system generates an output signal based at least on the first intermediate signal.

20 Claims, 8 Drawing Sheets

SYSTEMS AND METHODS FOR DIGITAL PREDISTORTION TO MITIGATE POWER AMPLIFIER BIAS CIRCUIT EFFECTS

TECHNICAL FIELD

Examples of the present disclosure generally relate to integrated circuits ("ICs") and, in particular, to an embodiment related to performing digital predistortion for cellular base station power amplifiers.

BACKGROUND

Wireless communications systems are widely deployed to provide various types of communication content such as voice, video, packet data, messaging, broadcast, and so on. Cellular base stations may communicate with user equipment (e.g. cell phones) bidirectionally. Communication from base station to user equipment is termed downlink (DL), and communication from user equipment to base station is termed uplink (UL). In some instances, UL and DL communication share the same resources (e.g. frequencies and/or beams) and are multiplexed over time. This may be referred to as time division duplexing (TDD).

In order to conserve power, some devices utilize lower power modes when not transmitting, for example a base station receiving an UL communication from a UE may conserve power by at least partially powering off an unutilized power amplifier which is used to amplify DL signals. When switching back on, there may be a period of time it takes before signals may be transmitted. To meet the demands for higher data rates and lower latency of wireless communications, it is desirable to minimize the startup time of re-powering a power amplifier when switching to a transmit mode. Accordingly, there is a need for improved systems and methods for preparing a wireless communication system for transmission when turning on input voltages.

SUMMARY

In some examples in accordance with the present disclosure, a digital predistortion (DPD) system includes an input configured to receive an input signal; a first signal path configured to generate a first signal based on the input signal; an error voltage provider configured to generate an error model signal modeled after a gate bias error voltage associated with the DPD system; a first combiner configured to combine the first signal and the error model signal to generate a first intermediate signal; and an output signal based at least on the first intermediate signal.

In some examples, the error voltage signal is a decaying oscillation.

In some examples, the error voltage signal is substantially monotonic.

In some examples, the error voltage provider is incremented by a time counter.

In some examples, a delay value is added to the time counter so that the DPD input is delayed relative to the time counter.

In some examples, the error voltage generator comprises a step signal provider coupled to an infinite impulse response (IIR) filter.

In some examples, the output signal is coupled to a Doherty amplifier.

In some examples, the DPD system further comprises a first plurality of combiners configured to generate a plurality of powers of the error model signal; a first plurality of signal paths configured to generate a first plurality of signals based on the input signal; and a second plurality of combiners configured to combine each of the first plurality of signals with a respective one of the plurality of powers of the error model signal to generate a first plurality of intermediate signals; wherein the output signal is also based the first plurality of intermediate signals.

In some examples, the DPD system further comprises: a second signal path configured to generate a second signal based on the input signal; wherein the output signal is also based on the second signal.

In some examples, the first plurality of signal paths are configured to perform respective functions related to a derivative of a function associated with the first signal path.

In some examples, a method comprises receiving an input signal at a signal path configured to generate a first signal based on the input signal; generating an error model signal modeled after a gate bias error voltage associated with an amplifier; combining the first signal and the error model signal to generate a first intermediate signal; and generating an output signal based at least on the first intermediate signal.

In some examples, the error model signal is a decaying oscillation.

In some examples, the error model signal is substantially monotonic.

In some examples, generating an error model signal further comprises generating a timer signal.

In some examples, a delay value is added to the timer signal.

In some examples, generating an error model signal further comprises: providing a step signal filtered with an infinite impulse response (IIR) filter.

In some examples, the output signal is provided to an input of a Doherty amplifier.

In some examples, the method further comprises: generating a plurality of powers of the error model signal; generating a first plurality of signals based on the input signal; and combining each of the first plurality of signals with a respective one of the plurality of powers of the error model signal to generate a first plurality of intermediate signals; wherein the generating the output signal is also based the first plurality of intermediate signals.

In some examples, the method further comprises: generating a second signal based on the input signal; wherein the generating the output signal is also based on the second signal.

In some examples, the generating a first plurality of signals is performed using a function related to a derivative of a function associated with the signal path.

Other aspects and features will be evident from reading the following detailed description and accompanying drawings.

DETAILED DESCRIPTION

Various embodiments are described hereinafter with reference to the figures, in which exemplary embodiments are shown. The claimed invention may, however, be embodied in different forms and should not be construed as being limited to the embodiments set forth herein. Like reference numerals refer to like elements throughout. Like elements will, thus, not be described in detail with respect to the description of each figure. It should also be noted that the figures are only intended to facilitate the description of the embodiments. They are not intended as an exhaustive description of the claimed invention or as a limitation on the scope of the claimed invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated, or if not so explicitly described. The features, functions, and advantages may be achieved independently in various embodiments or may be combined in yet other embodiments.

Before describing exemplary embodiments illustratively depicted in the several figures, a general introduction is provided to further understanding.

As discussed above, there is a desire for wireless communications to increase data rates and decrease latency of communications. For systems using time domain duplexing (TDD), the transition time between uplink (UL) and downlink (DL) may interfere with meeting the desired specifications. For example, release 16 of the 5G NR standard by 3GPP allows for a 10 μs transmitter transient period. Future releases of the standard or other standards may shorten this time requirement to increase performance. For example, transient periods of 1 μs or shorter may be required. In some base station transmitter systems, a limiting factor for the transition period is the settling time of a gate bias voltage.

In some power amplifiers, a bias voltage is applied to a portion of the electric circuit. The applied bias voltage may directly affect the behavior of the power amplifier, specifically the gain of the amplifier. The bias voltage may be adjusted when the power amplifier is not utilized, for example during the UL portion of a TDD mode communication. Under release 16 of the 5G NR standard, a settling time of 10 μs is permissible. Since the gate voltage affects the gain of the amplifier, transmitting while the gate voltage is not settled may result in a severe non-linear effect which may cause adjacent channel leakage and inter-carrier interference in cellular base stations.

To counteract the non-linear effects of the gate bias voltage, the systems and methods described further herein may be able to invert or change the power amplifier input signal such that the signal at the output of the power amplifier will still be linear and can be readily demodulated by a user equipment without interfering with devices using adjacent channels. Stated another way, if a power amplifier has a non-linearity 'x', a device may be configured to add inverse non-linearity '1/x' that will be cancelled out by the non-linearity 'x' of the power amplifier. As such, the signal at the output of the power amplifier is clean and linear. Generally, the process of adding in the non-linearity in advance is called predistorting or predistortion. When distortion is added digitally, the predistortion may be referred to as digital predistortion (DPD).

For example, in order to mitigate the gain difference while the gate voltage is settling, a predistortion may be applied to the signal being transmitted. A digital predistortion circuit for example may increase the amplifier input signal level when the gain of the amplifier is lower than desired and decrease the amplifier input signal when the gain is higher than desired.

In addition to the gain being dependent on the gate voltage, it may also be dependent on the signal input voltage as well. It is desirable to compensate for each of these effects. A digital predistortion system may predistort based on a time-varying gate bias signal, such as when the gate bias signal is transitioning. The DPD system be aware of when the gate bias voltage is transitioning. As such, it may time the predistortion filter such that it aligns with the transition of the gate bias voltage. A digital model of the transient gate voltage may be used in combination with one or more other filters to pre-distort the transmitted signal.

In some examples, when the gate bias voltage is switched on, the signal first overshoots the desired voltage, then oscillates about the desired voltage until settling. The digital model may reflect this oscillation. In other amplifier configurations, the gate bias voltage transition may not oscillate, but rather rise slowly. The digital model in that case would reflect this transient. In some examples, the digital predistortion filter is based on a Taylor series approximation of the ideal gain function. Each term of the Taylor series approximation may be a separate block to which the input signal is applied. Adjustments that are common to each term may be shared. For example, the derivative portion of each Taylor series term may be a separate block, and each of those blocks may be combined with a power of the gate voltage.

In some examples, the digital predistortion system may be utilized with a Doherty amplifier. For example, each amplifier portion (the carrier amplifier and the peaking amplifier) may have an input which is generated by a respective digital predistortion system. The digital predistortion systems may not be completely independent, but have some shared components.

With the above general understanding borne in mind, various embodiments for providing methods and circuits for predistortion for power amplifiers are generally described below. Because one or more of the above-described embodiments are exemplified using a particular type of IC, a detailed description of such an IC is provided below. However, it should be understood that other types of ICs may benefit from one or more of the embodiments described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device (CPLD). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

In general, each of these programmable logic devices ("PLDs"), the functionality of the device is controlled by configuration data provided to the device for that purpose. The configuration data can be stored in volatile memory (e.g., static memory cells, as common in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Figure 1:
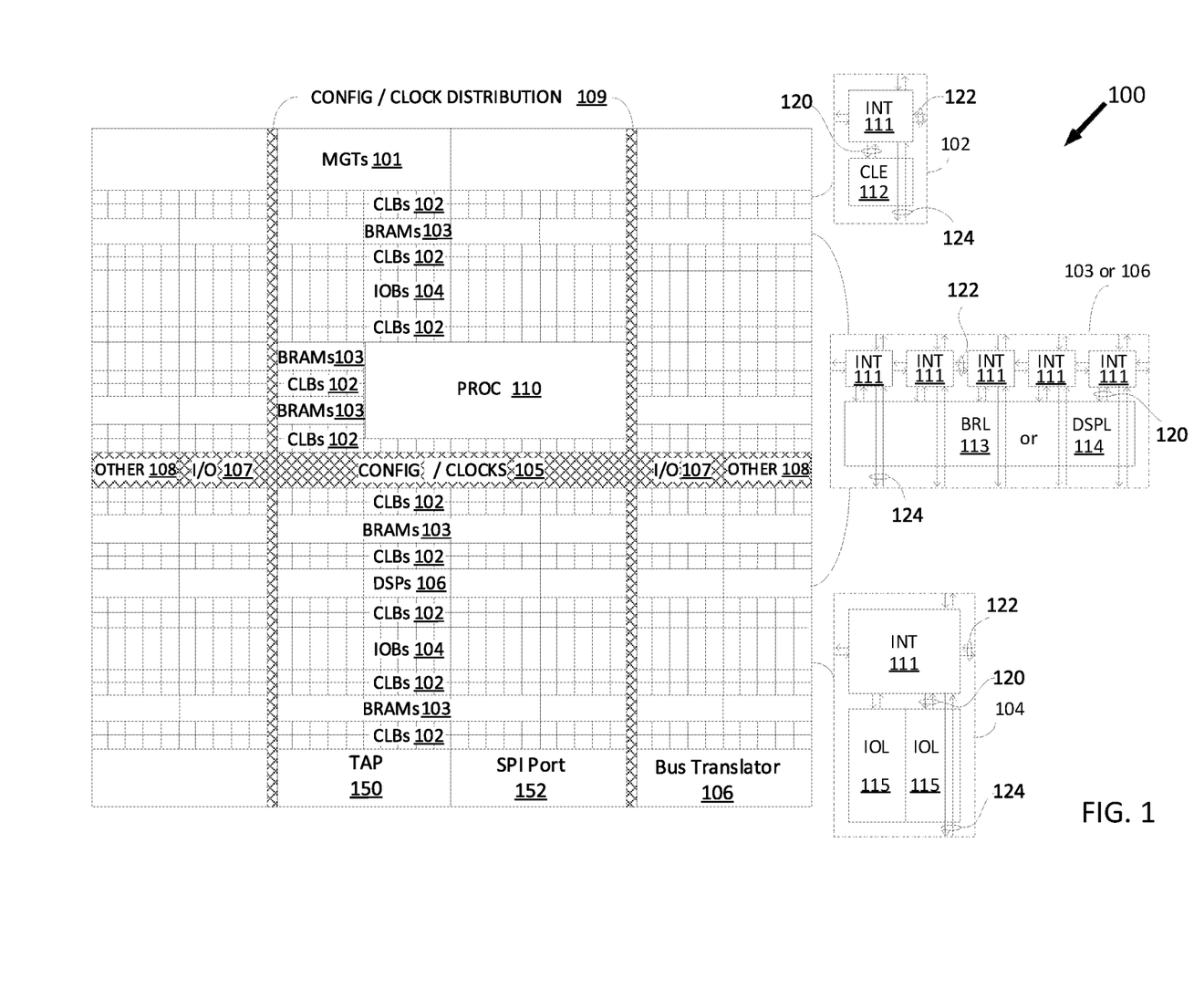
FIG. 1 is a block diagram illustrating an exemplary architecture for an IC, according to some embodiments of the present disclosure.

As noted above, advanced FPGAs can include several different types of programmable logic blocks in the array. For example, FIG. 1 illustrates an exemplary FPGA architecture 100. The FPGA architecture 100 includes a large number of different programmable tiles, including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110. In some embodiments, the FPGA architecture 100 includes an RF data converter subsystem, which contains multiple radio frequency analog-to-digital converters (RF-ADCs) and multiple radio frequency digital-to-analog converters (RF-DACs). In various examples, the RF-ADCs and RF-DACs may be individually configured for real data or can be configured in pairs for real and imaginary I/O data. In at least some examples, the FPGA architecture 100 may implement an RFSoC device.

In some FPGAs, each programmable tile can include at least one programmable interconnect element ("INT") 111 having connections to input and output terminals 120 of a programmable logic element within the same tile, as shown by examples included at the top of FIG. 1. Each programmable interconnect element 111 can also include connections to interconnect segments 122 of adjacent programmable interconnect element(s) in the same tile or other tile(s). Each programmable interconnect element 111 can also include connections to interconnect segments 124 of general routing resources between logic blocks (not shown). The general routing resources can include routing channels between logic blocks (not shown) comprising tracks of interconnect segments (e.g., interconnect segments 124) and switch blocks (not shown) for connecting interconnect segments. The interconnect segments of the general routing resources (e.g., interconnect segments 124) can span one or more logic blocks. The programmable interconnect elements 111 taken together with the general routing resources implement a programmable interconnect structure ("programmable interconnect") for the illustrated FPGA.

In an example implementation, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the example of FIG. 1, an area (depicted horizontally) near the center of the die (e.g., formed of regions 105, 107, and 108 shown in FIG. 1) can be used for configuration, clock, and other control logic. Column 109 (depicted vertically) extending from this horizontal area or other columns may be used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, PROC 110 spans several columns of CLBs and BRAMs. PROC 110 can include various components ranging from a single microprocessor to a complete programmable processing system of microprocessor(s), memory controllers, peripherals, and the like.

In one aspect, PROC 110 is implemented as a dedicated circuitry, e.g., as a hard-wired processor, that is fabricated as part of the die that implements the programmable circuitry of the IC. PROC 110 can represent any of a variety of different processor types and/or systems ranging in complexity from an individual processor, e.g., a single core capable of executing program code, to an entire processor system having one or more cores, modules, co-processors, interfaces, or the like.

In another aspect, PROC 110 is omitted from architecture 100, and may be replaced with one or more of the other varieties of the programmable blocks described. Further, such blocks can be utilized to form a "soft processor" in that the various blocks of programmable circuitry can be used to form a processor that can execute program code, as is the case with PROC 110.

The phrase "programmable circuitry" can refer to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 1 that are external to PROC 110 such as CLBs 102 and BRAMs 103 can be considered programmable circuitry of the IC.

In some embodiments, the functionality and connectivity of programmable circuitry are not established until configuration data is loaded into the IC. A set of configuration data can be used to program programmable circuitry of an IC such as an FPGA. The configuration data is, in some cases, referred to as a "configuration bitstream." In general, programmable circuitry is not operational or functional without first loading a configuration bitstream into the IC. The configuration bitstream effectively implements or instantiates a particular circuit design within the programmable circuitry. The circuit design specifies, for example, functional aspects of the programmable circuit blocks and physical connectivity among the various programmable circuit blocks.

In some embodiments, circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 110.

In some instances, hardwired circuitry can have one or more operational modes that can be set or selected according to register settings or values stored in one or more memory elements within the IC. The operational modes can be set, for example, through the loading of a configuration bitstream into the IC. Despite this ability, hardwired circuitry is not considered programmable circuitry as the hardwired circuitry is operable and has a particular function when manufactured as part of the IC.

FIG. 1 is intended to illustrate an exemplary architecture that can be used to implement an IC that includes programmable circuitry, e.g., a programmable fabric. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual IC, more than one adjacent row of CLBs is typically included wherever the CLBs appear, to facilitate the efficient implementation of user logic, but the number of adjacent CLB rows varies with the overall size of the IC. Moreover, the FPGA of FIG. 1 illustrates one example of a programmable IC that can employ examples of the interconnect circuits described herein. The interconnect circuits described herein can be used in other types of programmable ICs, such as CPLDs or any type of programmable IC having a programmable interconnect structure for selectively coupling logic elements.

It is noted that the IC that may implement the methods and circuits for predistortion for power amplifiers is not limited to the exemplary IC depicted in FIG. 1, and that ICs having other configurations, or other types of ICs, may also implement the methods and circuits for predistortion for power amplifiers.

Figure 2:
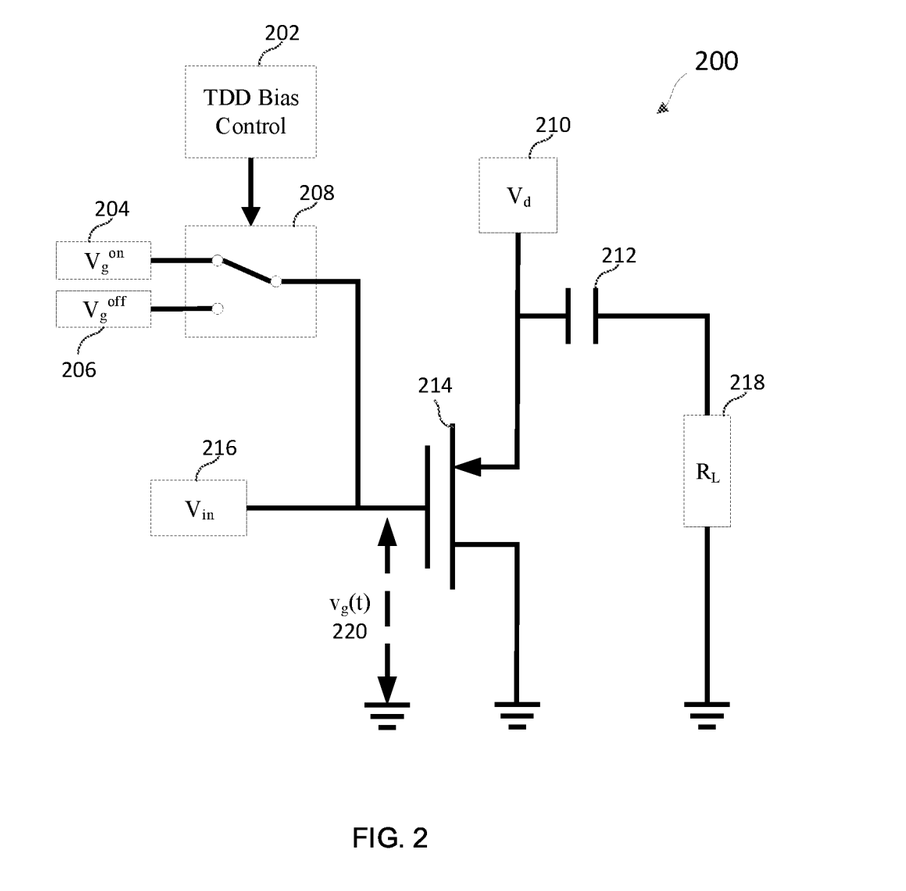
FIG. 2 is a block diagram illustrating an exemplary power amplifier circuit according to some embodiments of the present disclosure.

FIG. 2 is a block diagram illustrating a power amplifier circuit 200 (also referred to as amplifier 200). Amplifier 200 is exemplary as the methods and devices described herein may be applied to a number of different amplifier configurations. The devices illustrated in FIG. 2 may each be understood to be discrete devices, comprised of multiple devices, or intrinsic properties (e.g. intrinsic resistance of a trace or parasitic capacitance). As shown, TDD bias control 202 may be used to control switch 208 and select a bias voltage to be applied to the gate of transistor 214. When the amplifier is turned on, voltage $V_g^{on}$ 204 is applied, and when it is turned off, voltage $V_g^{off}$ 206 is applied. The bias voltage sets the DC operating point (Q-point) of the amplifier producing gate voltage $V_g(t)$ 220 around which the input signal $V_{in}$ is centered. The transistor 214 in combination with supply voltage $V_d$ 210 amplifies voltage $V_{in}$ 216. A signal having a voltage proportional to $V_{in}$ 216 is driven across the load $R_L$ 218 through capacitor 212. Load $R_L$ 218 may be, for example, an antenna. There are additional intrinsic devices not illustrated, such as intrinsic inductance which may be present allowing for the device to oscillate.

The gain of amplifier 200 may depend on the bias voltage applied at the gate $V_g(t)$ 220. When switching to a transmitting mode from a non-transmitting mode, TDD bias control 202 may be used to control switch 208 and switch from $V_g^{off}$ 206 to $V_g^{on}$ 204. When this happens, $V_g(t)$ 220 may not instantly reach the applied voltage, but rather there will be a transient period during which $V_g(t)$ 220 will settle. During this transient period, the gain of the amplifier will change over time. A signal applied at $V_{in}$ 216 during this transient period will be amplified in a non-linear way, which may cause problems including noise in unintended frequency channels. This noise may be characterized as an adjacent channel power ratio (ACPR) which is a ratio between the total power of adjacent channel to the main channel's power. In order to maintain ACPR within acceptable levels, a signal may not be applied at $V_{in}$ 216 until the bias voltage has sufficiently settled after transitioning. $V_{in}$ 216 may be predistorted as described herein such that the signal may be transmitted earlier while the bias signal is still settling.

Figure 3A:
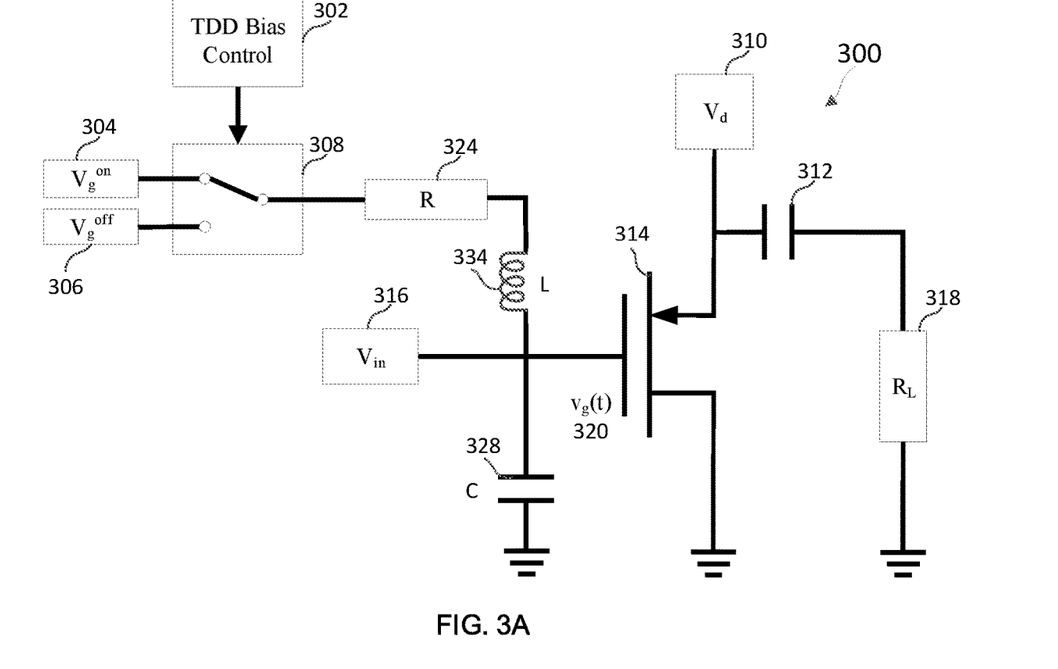
FIG. 3A is a block diagram illustrating an exemplary power amplifier circuit according to some embodiments of the present disclosure.

FIG. 3A is a block diagram illustrating an exemplary power amplifier circuit 300. The amplifier circuit is similar to that shown in FIG. 2. For example, power amplifier circuit 300 includes $V_g^{on}$ 304, $V_g^{off}$ 306, TDD bias control 302, bias voltage switch 308, $V_{in}$ 316, $V_g(t)$ 320, transistor 314, supply voltage $V_d$ 310, capacitor 312, and load $R_L$ 318 which behave in a similar manner as their respective parts $V_g^{on}$ 204, $V_g^{off}$ 206, TDD bias control 202, switch 208, $V_{in}$ 216, $V_g(t)$ 220, transistor 214, supply voltage $V_d$ 210, capacitor 212, and load $R_L$ 218. discussed with respect to FIG. 2. The amplifier 300 may, for example, be a relatively lower power amplifier for a small cell base station. The devices illustrated in FIG. 3A may each be understood to be discrete devices, comprised of multiple devices, or intrinsic properties (e.g. intrinsic resistance of a trace or parasitic capacitance). There may be a resistance 324 and inductance 334 between the bias voltage switch 308 and the input to the power amplifier package 332. There may be a capacitor 328 between transistor 314 and ground. There may also be a capacitor 312 in series with load $R_L$ 318. The components of the circuit together cause the transient response to a step in the gate voltage Vg(t) which may oscillate as described below with respect to FIG. 4B.

Figure 3B:
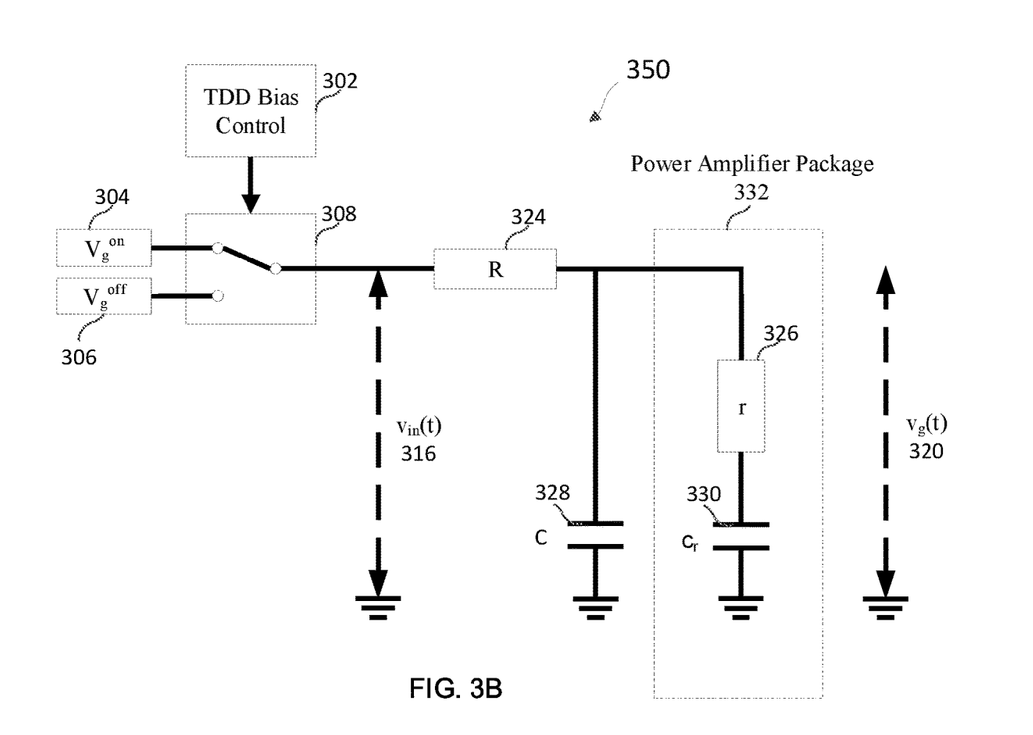
FIG. 3B is a block diagram illustrating an exemplary power amplifier circuit according to some embodiments of the present disclosure.

FIG. 3B is a block diagram illustrating an exemplary power amplifier circuit 350. The amplifier circuit is similar to that shown in FIG. 2. For example, power amplifier circuit 350 includes $V_g^{on}$ 304, $V_g^{off}$ 306, TDD bias control 302, bias voltage switch 308, $V_{in}(t)$ 316, and $V_g(t)$ 320 which behave in a similar manner as their respective parts $V_g^{on}$ 204, $V_g^{off}$ 206, TDD bias control 202, switch 208, $V_{in}$ 216, and $V_g(t)$ 220 discussed with respect to FIG. 2. Additional features which may be the same as amplifier 200 such as transistor 214 are omitted for clarity. The amplifier 350 may, for example, be a relatively larger power amplifier for a macro cell base station. The devices illustrated in FIG. 3B may each be understood to be discrete devices, comprised of multiple devices, or intrinsic properties (e.g. intrinsic resistance of a trace or parasitic capacitance). There may be a resistance 324 between the bias voltage switch 308 and the input to the power amplifier package 332. There may be a capacitor 328 external to the power amplifier package 332 input. There may also be a resistance 326 and a capacitor 330 in series with resistance 326 within the power amplifier package 332. The larger capacitance both inside and outside the power amplifier package 332 may cause the transient response to a step in the gate voltage Vg(t) to differ from that of power amplifier 300 as described below with respect to FIG. 4C.

Figure 4A:
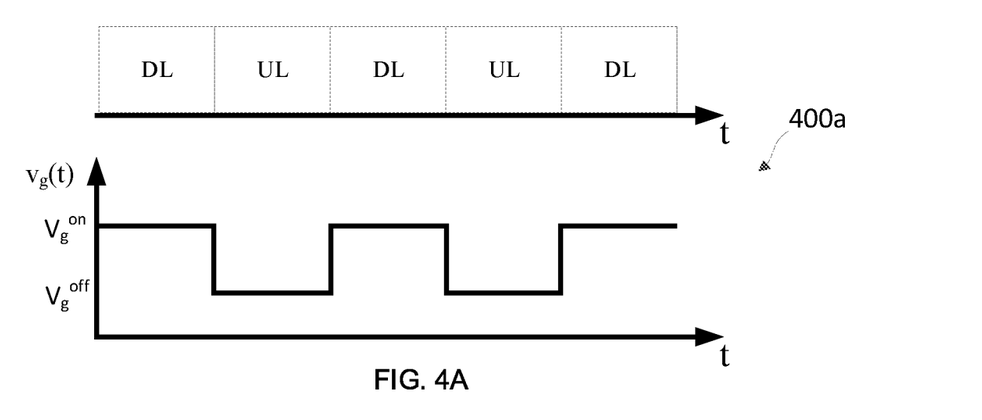
FIG. 4A is a schematic diagram of an exemplary transitioning gate voltage according to some embodiments of the present disclosure.

FIG. 4A illustrates a schematic diagram 400a of an exemplary transitioning gate voltage. The upper portion represents a cellular base station TDD communication scheme alternating between UL and DL periods over time. Corresponding to the UL and DL periods, the lower portion illustrates the bias voltage applied at $V_g(t)$ 220 changing between $V_g^{off}$ during UL, and $V_g^{on}$ during DL. While schematically this transition is represented as happening instantly, in reality the transition time is non-zero. During DL, the gate voltage is turned on so that the amplifier may function as intended. During UL, the amplifier is not needed as the system is receiving a signal rather than transmitting, so the gate bias voltage may be turned off to conserve power.

Figure 4B:
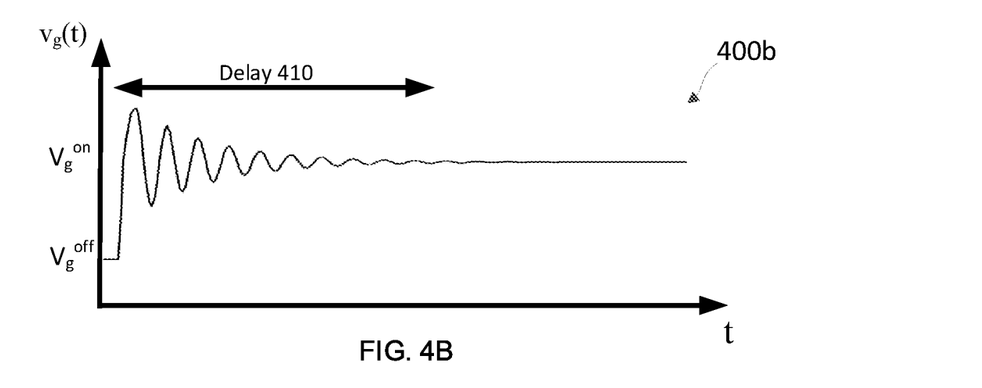
FIG. 4B is a schematic diagram of an exemplary transitioning gate voltage according to some embodiments of the present disclosure.

FIG. 4B illustrates a schematic diagram 400b of an exemplary transitioning gate voltage. This may be the bias voltage transition, for example, of a small-cell base station power amplifier. The amplifier may be an amplifier 200 as discussed with reference to FIG. 2. The resistance, inductance, and capacitance (including intrinsic devices) may cause a ringing to occur. The ringing may be dampened such that eventually the voltage substantially settles to the desired voltage as shown. The amount of time it takes to settle may be on the order of about 10 μs.

A dampened oscillation such as the one in schematic diagram 400b in an RLC circuit (such as at the input of amplifier 200) with input of a step signal (such as switching from $V_g^{off}$ to $V_g^{on}$) can be described by the following $2^{nd}$ differential equation:

$$\frac{d^2 v_g(t)}{dt^2} + 2\alpha \frac{dv_g(t)}{dt} + \omega_0^2 v_g(t) = 0$$

where:

$$\alpha = \frac{R}{2L}, \quad \omega_0^2 = \frac{1}{LC}$$

Solving for the gate voltage with respect to time gives:

$$v_g(t) = \left(v_g^{off} - v_g^{on}\right) \frac{\sin(\omega t + \theta)}{\sin(\theta)} e^{-\alpha t} + v_g^{on}$$

This is the voltage illustrated in diagram 400b. As shown, the voltage rises beyond $V_g^{on}$ and oscillates until settling near $V_g^{on}$. Without predistortion, the system may need to wait for delay time 410 before transmitting using the power amplifier so that the gate voltage, and therefore the amplifier gain, is steady. The difference between $v_g(t)$ and $v_g^{on}$ (the error voltage) after a power amplifier is turned on due to the bias circuit RLC effect is:

$$\Delta v_g = \left(v_g^{off} - v_g^{on}\right) \frac{\sin(\omega t + \theta)}{\sin(\theta)} e^{-\alpha t}$$

where:

$$\omega = \sqrt{\omega_0^2 - \alpha^2}, \quad \sin(\theta) = \frac{1}{\sqrt{1 + \left(\frac{\alpha}{\omega}\right)^2}}$$

replacing the constants with A, the voltage difference is:

$$\Delta v_g = A \sin(\omega t + \theta) e^{-\alpha t}$$

where:

$$A = \frac{v_g^{off} - v_g^{on}}{\sin(\theta)}$$

Figure 4C:
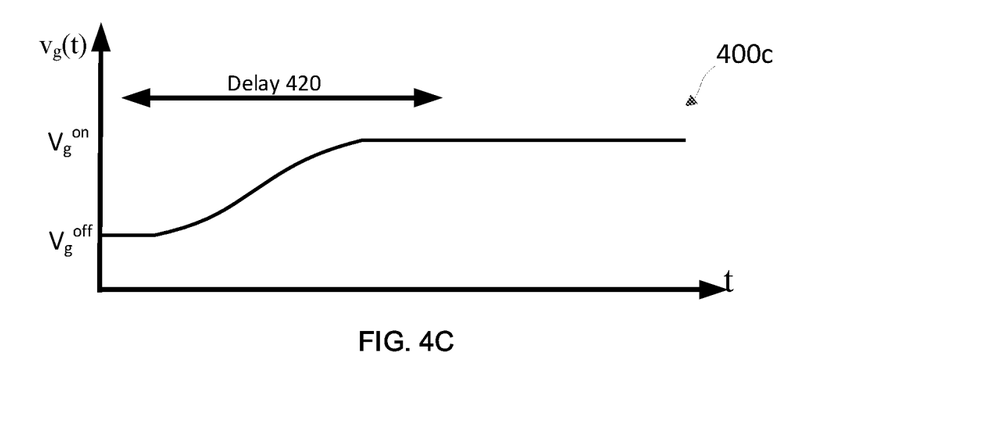
FIG. 4C is a schematic diagram of an exemplary transitioning gate voltage according to some embodiments of the present disclosure.

FIG. 4C illustrates a schematic diagram 400c of an exemplary transitioning gate voltage. In some examples, larger power amplifiers (for example power amplifier 350) may have larger bias capacitance and larger capacitance inside the power amplifier package. For this reason, the shape of the transient may be different than for a micro cell. A RC2 circuit such as that shown in FIG. 3B can be described by the following $2^{nd}$ derivative equation:

$$(RC * rc_r) * \frac{d^2 v_g(t)}{dt^2} + ((R+r)c_r + RC) * \frac{dv_g(t)}{dt} + v_g(t) = v_{in}$$

the solution is:

$$v_g(t) = \frac{\alpha_2}{\alpha_2 - \alpha_1}\left(v_g^{off} - v_g^{on}\right)\left(e^{-\alpha_1 t} - \frac{\alpha_1}{\alpha_2} e^{-\alpha_2 t}\right) + v_g^{on}$$

where:

$$\alpha_{1,2} = \frac{-\left((R+r)c_r + RC\right) \pm \sqrt{((R+r)c_r + RC)^2 - 4(RC)(rc_r)}}{2(RC)(rc_r)}$$

This is the voltage illustrated in schematic diagram 400c. As can be seen, rather than oscillating like the voltage in diagram 400b (although some small oscillations may be present), the rise time is slow, which can be explained by the larger capacitance of the circuit. The shape of the slope may be substantially monotonic, however a small amount of noise or minor oscillations (e.g. less than 10% of the height of the entire slope) in the signal may cause local non-monotonicity. Without predistortion, the system may need to wait for delay time 420 before transmitting using the power amplifier so that the gate voltage, and therefore the amplifier gain, is steady. The difference in voltage from the final on voltage (the error voltage) is:

$$\Delta v_g(t) = \frac{\alpha_2}{\alpha_2 - \alpha_1}\left(v_g^{off} - v_g^{on}\right)\left(e^{-\alpha_1 t} - \frac{\alpha_1}{\alpha_2}e^{-\alpha_2 t}\right)$$

With an understanding of possible gate voltage transient responses, we now turn to a discussion of a digital predistortion system which may compensate for the time-varying gain due to the transient of the gate voltage. As discussed above, a power amplifier gain is a function of gate bias voltage $v_g$. When a power amplifier gain is changing with time it will generate severe non-linear effects, which cause excessive adjacent channel leakage and inter-carrier interference, for example in cellular base stations. Digital predistortion (DPD) may be used to compensate the power amplifier non-linear effect. Hence, the DPD gain may be based on the amplifier gain, and so will also be a function of gate voltage $v_g(t)$ and input voltage $x(t)$:

$$\text{Gain}_{DPD} = \text{Gain}_{DPD}(V_g^{on} + \Delta v_g(t), x(t))$$

This says that the DPD gain is a function of the gate voltage $v_g(t)$ and the input voltage $x(t)$, e.g. $v_{in}(t)$, which each vary in time. The gate voltage $v_g(t)$ may be divided into the final fixed voltage $V_g^{on}$, and a time varying error voltage $\Delta v_g(t)$. The DPD gain may be approximated by a series expansion, such as a Taylor series expansion, taken to some finite number of terms K as shown here:

$$\text{Gain}_{DPD} \cong \text{Gain}_{DPD}(V_g^{on}, x(t)) + \sum_{k=1}^{K} \frac{d^k \text{Gain}_{DPD}(v_g = V_g^{on}, x(t))}{dv_g^k}(\Delta v_g(t))^k$$

In the formula above, the $0^{th}$ term of the series expansion is separated out of the summation. This term may be understood to represent the DPD gain with constant gate bias $V_g^{on}$. The remaining components within the summation may be understood to represent the DPD gain which compensate for the time varying component of $v_g$. Multiplying the gain by the input x provides the DPD function. In the digital (sampled) domain, this may be represented as:

$$DPD = DPD_{main} + \sum_{k=1}^{K} DPD_{RLC}^k * (\Delta v_g)^k$$

where $$DPD_{main} = x(n) * \text{Gain}_{DPD}(V_g^{on}, x(n))$$

$$DPD_{RLC}^k = x(n) * \frac{d^k \text{Gain}_{DPD}(v_g = v_g^{on}, x(n))}{dv_g^k}$$

A factor of k! has been omitted from the denominator of each of the summation terms above as that is a constant for each term which may simply be a scaling factor applied in each DPD block (e.g. signal path). As may be seen in the equation, each of the summation terms includes the kth derivative of $\text{Gain}_{DPD}$ with respect to $v_g$.

The K chosen for the summation affects the accuracy of the approximation. More specifically, the series expansion approximates the function most closely at $V_g^{on}$, and generally diverges more the further $v_g(t)$ is from $V_g^{on}$. The more terms included, the further $v_g(t)$ may be from $V_g^{on}$ and still approximate the function closely enough to sufficiently compensate for the distortion. In an example, three terms of the summation are used (K=3), although any number may be used depending on the requirements. Generally, the shorter the permissible delay period before transmitting after turning on the gate voltage, the more terms that are needed.

Figure 5:
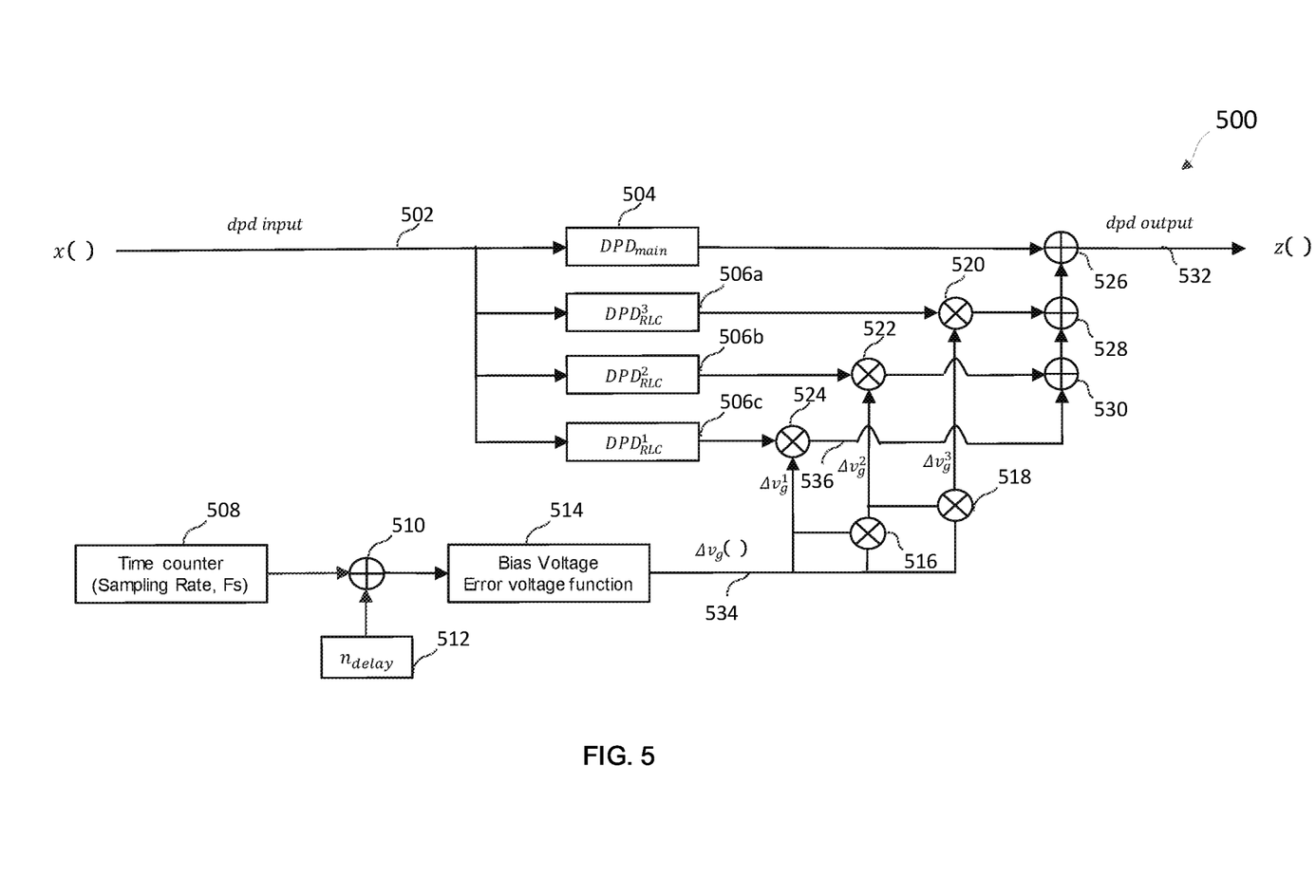
FIG. 5 is a schematic diagram of an exemplary digital predistortion (DPD) system according to some embodiments of the present disclosure.

FIG. 5 is a schematic diagram of an exemplary digital predistortion (DPD) system 500. DPD system 500 may be used to implement the DPD function described above. DPD input x(n) 502 may be the signal to be transmitted by an amplifier connected to DPD output 532 (also referred to as output 532). $DPD_{main}$ block 504 may apply the DPD function described above, namely $x(n)*\text{Gain}_{DPD}(V_g^{on}, x(n))$ which represents the DPD gain for constant gate bias voltage. $DPD_{RLC}$ blocks 506a-506c may apply the function as described above for the terms including the derivative of the gain function, namely $$x(n) * \frac{d^k \text{Gain}_{DPD}(v_g = v_g^{on}, x(n))}{dv_g^k}.$$

As the error voltage $\Delta v_g$ (or a power of $\Delta v_g$) is multiplied by each of the summation terms in the equations above, $\Delta v_g$ is modeled by bias voltage error voltage provider 514 (e.g., using a function generator) so that it may be multiplied by the outputs of the $DPD_{RLC}$ blocks. Bias voltage error voltage provider 514 generates the model of the error voltage starting at a time associated with the gate voltage switching. Time counter 508 provides a counter signal which may be used by bias voltage error voltage provider 514 to time the signal it generates. In order to align the generated error voltage with the actual error voltage accurately, a delay generator 512 may provide a delay which is added to the counter signal using combiner 510. For example, combiner 510 may be an adder. Adding a positive value to the counter in effect advances the error voltage model forward in time relative to input signal x(n) 502. Time counter 508, combiner 510, delay generator 512, and bias voltage error voltage function 514 may together be considered an error model provider. The error model provider may be composed of circuitry, software, or a combination of the two.

The output of $DPD_{RLC}$ block 506c is combined with the generated error model signal $\Delta v_g(n)$ generated by bias voltage error voltage provider 514 to provide intermediate signal 536 using combiner 524 (here a multiplier). Combiners 516 and 518 may be used to generate powers of $\Delta v_g(n)$, for example $(\Delta v_g(n))^2$ and $(\Delta v_g(n))^3$. These correspond to the $(\Delta v_g)^k$ terms in the equations above. As such, the $\Delta v_g(n)$ powers are combined with the outputs of the corresponding $DPD_{RLC}$ blocks 506a and 506b using corresponding combiners 520 and 522. The combined $DPD_{RLC}$ and $\Delta v_g(n)^{\wedge}k$ terms are combined (added) with the $DPD_{main}$ block 504 output using combiners (e.g., adders) 526, 528, and 530 to generate DPD output 532.

As discussed above, fewer or more $DPD_{RLC}$ terms may be used depending on the requirements. Each successive $DPD_{RLC}$ block includes the next derivative of the gain function, any constant scaling factor, and is multiplied by a corresponding $(\Delta v_g(n))^k$ term and summed to the other multiplied terms to generate the output 532. The various DPD blocks and combiners may be implemented using circuitry, software, or some combination.

The generated model of the error voltage $\Delta v_g(n)$ may be generated in a number of different ways. In one example, bias voltage error voltage provider 514 may include a block generating an oscillating signal with a sampling frequency $F_s$ following the form of $$\sin\left(\frac{\omega}{F_s}(n + n_{delay}) + \theta\right)$$

and a block generating a decaying signal following the form of e $$-\frac{\alpha}{F_s}(n + n_{delay}).$$

These blocks may then be multiplied together to form a decaying oscillation approximation of a gate voltage transient such as the one discussed with respect to FIG. 4B. The error voltage model may run continuously or may terminate after a predetermined amount of time after which it outputs a fixed value until another transition occurs.

In another example, bias voltage error voltage provider 514 may include a block generating a decaying exponential function with a sampling frequency $F_s$ and the form of e $$-\frac{\alpha_1}{F_s}(n + n_{delay})$$

and another block generating a decaying exponential function having the form of $$e^{-\frac{\alpha}{F_s}(n + n_{delay})}.$$

The second block (containing the $\alpha_2$ term) may be combined (multiplied) by a constant $-\alpha_1/\alpha_2$, the result of which may be combined (added) to the output of the first block to generate the resulting gate voltage model. This effectively produces a model such as the non-oscillating function described above with respect to FIG. 4C.

For each of the above described methods of generating a model error voltage, the implementation details may vary. For example, some functions or portions of functions may be implemented as lookup tables rather than math logic units. Lookup tables may be interpolated as necessary to provided additional accuracy. For example, the sin( ) function may be implemented as a lookup table. In some instances the sample rates of the functions or portions of the functions may vary and later by decimated, interpolated, or otherwise filtered as necessary to balance design constraints such as timing and logic element constraints.

As the gate voltage transient response may be different with different components and different conditions, it may be necessary to adjust parameters of the various blocks described above at different points. For example, default parameters may be set based on known component values (e.g. capacitance and resistance values) of the circuit. Adjustments may be made when doing initial testing or bring-up of the system to tune the parameters based on actual values. Variations over time, voltage, temperature, or other factors may require adjustments to be made automatically by the system. A cellular base station may monitor the actual voltages of the system such that it may update parameters to adjust for any perceived changes. A base station may monitor parameters such as temperature, and/or measure the gate voltage directly. This information may be used to adjust the parameters that are inputs to the equations which model the gate voltage behavior. Component behavior over temperature may be determined either empirically or by reference to an existing component model library.

Figure 6:
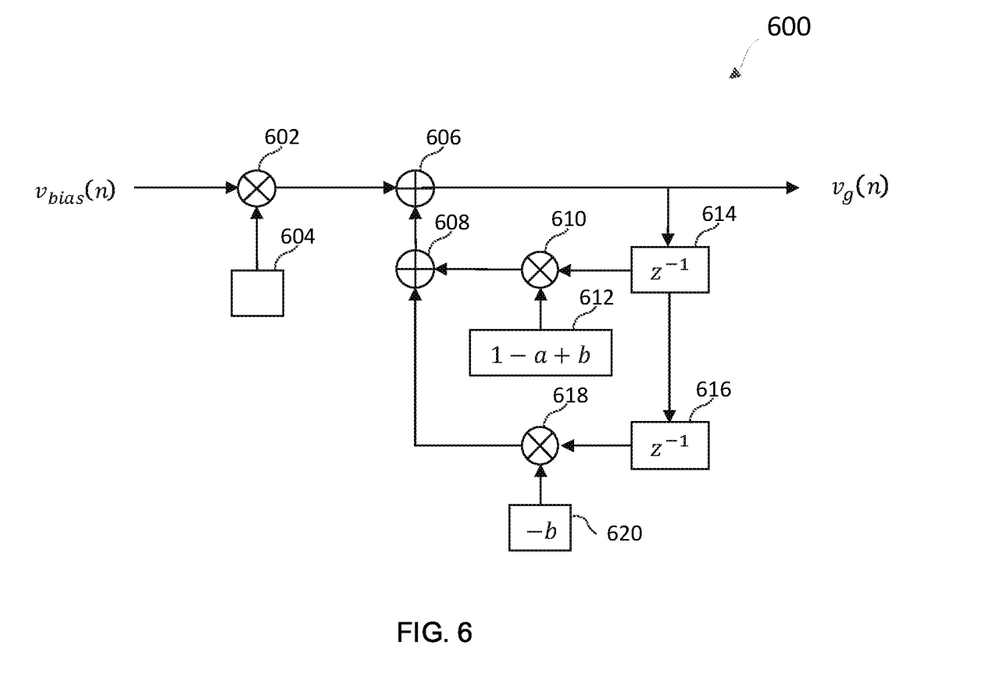
FIG. 6 is a schematic diagram of an exemplary infinite impulse response (IIR) filter according to some embodiments of the present disclosure.

FIG. 6 illustrates a schematic diagram of an infinite impulse response (IIR) filter which may also be used to generate a model gate voltage function to be used with bias voltage error voltage provider 514. A step (e.g. a step from $V_g^{off}$ to $V_g^{on}$) may be generated at the input of the IIR filter such that the timing corresponds to the actual gate voltage transition. The gate voltage equation discussed with reference to FIG. 4B may be represented in the digital domain with a sampling frequency $F_s$ as such:

$$v_g(n) = (1 - a + b)v_g(n-1) - bv_g(n-2) + av_{bias}(n)$$

where $$a = \frac{1}{1 + \frac{2\alpha F_s}{\omega_0^2} + \frac{F_s^2}{\omega_0^2}}$$

and $$b = \frac{\frac{F_s^2}{\omega_0^2}}{1 + \frac{2\alpha F_s}{\omega_0^2} + \frac{F_s^2}{\omega_0^2}}$$

and $$\alpha = \frac{R}{2L}, \quad \omega_0^2 = \frac{1}{LC}$$

To implement the above equation, IIR filter 600 includes a number of functional blocks. Block 604 stores constant "a" which is combined (multiplied) by the input signal with combiner 602. Combiner 606 adds this scaled input signal to a feedback signal. The feedback signal comprises delay signals from delay generators 614 and 616. Delay generator 614 feeds its output to delay generator 616 and combiner 610. Combiner 610 multiplies delay from delay generator 614 by constant block 612 which outputs parameter 1−a+b. Delay generator 616 feeds its output to combiner 618, which combines the delay from delay generator 616 with constant 620 (e.g., output the parameter "−b"). The outputs of combiners 610 and 618 are combined (e.g., added) together with combiner 608 whose output is added to the scaled input with combiner 606 as stated above. By utilizing feedback, the impulse response is able to continue indefinitely without an excessive amount of stored coefficients as may be needed for a finite impulse response (FIR) filter. As will be shown in FIG. 7, the input to the IIR filter 600 may be a step signal which is configured to step when the gate voltage switches on a power amplifier. The step signal filtered through the IIR filter may then generate a model which approximates the actual transient gate voltage. Subtracting $V_g^{on}$ from the model may produce an error voltage. This step signal in combination with the IIR filter and subtraction may be used as another method to generate the bias voltage error signal as discussed above with reference to FIG. 5.

As discussed above with reference to DPD system 500, the IIR filter 600 may have parameters adjusted at different points. Additionally, implementation details such as lookup tables and modifying sample rates may be utilized to increase performance.

Figure 7:
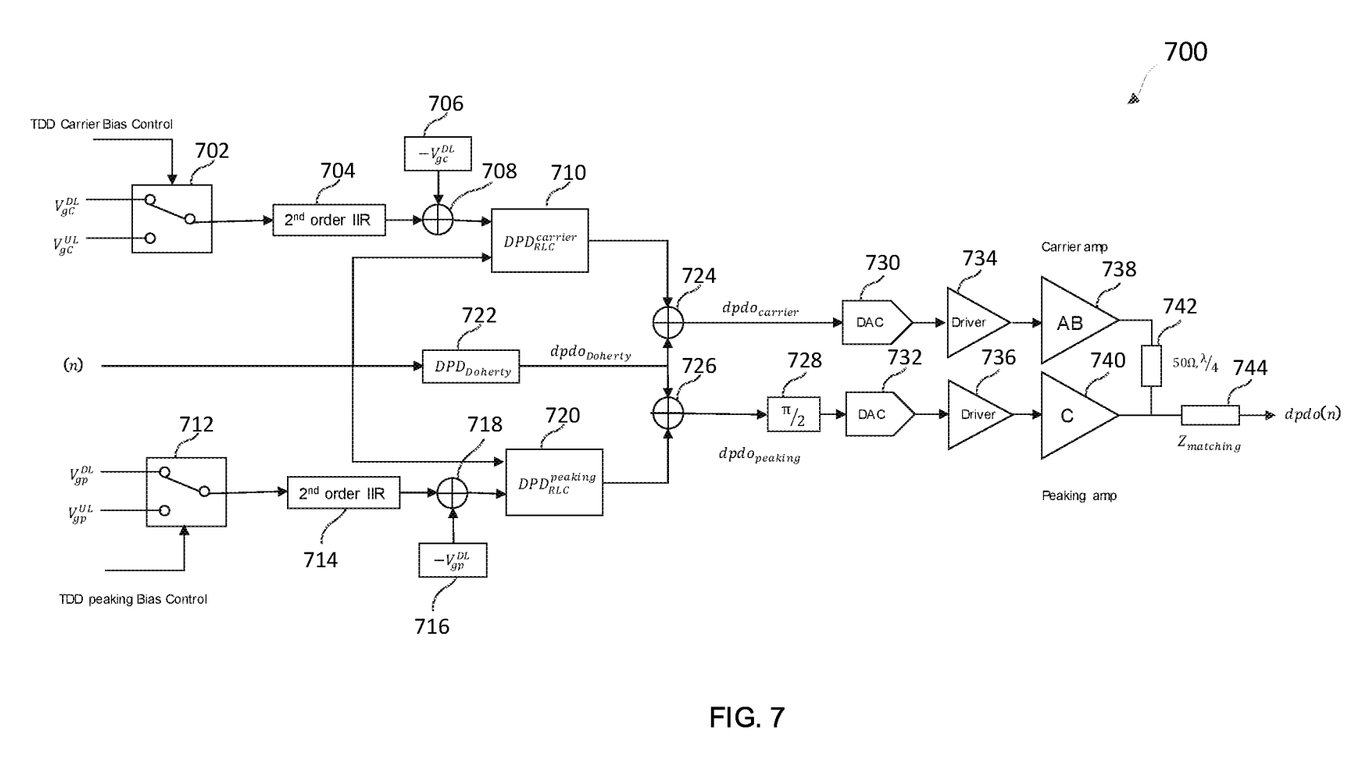
FIG. 7 is a schematic diagram of an exemplary digital front-end (DFE) system according to some embodiments of the present disclosure.

FIG. 7 is a schematic diagram of an exemplary digital front-end (DFE) system 700. DFE system 700 combines elements already discussed such as a DPD system and a power amplifier. The power amplifier illustrated in DFE system 700 is a Doherty amplifier in a multi-inputs single-output architecture. A Doherty amplifier combines a class AB carrier amplifier 738 (also referred to as a carrier amplifier 738) with a class C peaking amplifier 740 (also referred to as a peaking amplifier 740). The peaking amplifier 740 is designed such that it only functions when the input signal is above a certain threshold, such that carrier amplifier 738 is assisted when more power is required. The outputs of the individual amplifiers are combined through a resistive element 742 and fed through an impedance matching device 744 which provides the output which may drive an antenna.

Switching block 702 provides a step signal which is fed into an IIR filter 704, which may be IIR filter 600. The step signal provider simulates a step from $V_{gc}^{UL}$ to $V_{gc}^{DL}$ which are respectively the gate bias voltage of the carrier amplifier during uplink, and the gate bias voltage of the carrier amplifier during downlink. The step signal provider put through the IIR filter 704 produces a simulated model of the transient response to the gate voltage at the carrier amplifier when switched. In order to produce an error voltage $\Delta v_g$, combiner 708 adds a negative version of the final gate voltage ($-V_{gc}^{DL}$) from constant block 706. DPD block 710 takes the error voltage output of combiner 708 and applies it to one or more DPD blocks such as the $DPD_{RLC}$ blocks described with reference to FIG. 5. The input signal x(n) is also provided to DPD block 710 which is used as described with reference to FIG. 5.

A separate DPD system may be provided for the peaking amplifier, which is constructed in a similar manner to the DPD system for the carrier amplifier. Switching block 712, IIR filter 714, constant block 716, combiner 718, and DPD block 720 may be configured to behave in a similar manner to switching block 702, IIR filter 704, constant block 706, combiner 708, and DPD block 710 respectively. One difference between the DPD system for the peaking amplifier, however, is the simulated gate voltages used are $V_{gp}^{UL}$ and $V_{gp}^{DL}$ which are respectively the gate bias voltage of the peaking amplifier during uplink, and the gate bias voltage of the peaking amplifier during downlink.

The $DPD_{main}$ term discussed with reference to FIG. 5 may be provided individually for each DPD block 710 and 720, or there may be a shared $DPD_{Doherty}$ 722 which provides a combined DPD block that accounts for the gain of the Doherty amplifier when each of the carrier amplifier 738 and the peaking amplifier 740 are biased with their downlink gate bias voltage. $DPD_{Doherty}$ takes the input signal x(n) as an input and applies its predistortion to generate $dpdo_{Doherty}$ which is combined with the outputs of DPD block 710 and DPD block 720 using combiners 724 and 726 respectively. The output of combiner 724 contains the predistorted digital signal for the carrier amplifier which is turned into an analog signal using digital to analog converter (DAC) 730. Driver 734 buffers the output of DAC 730 in order to drive the carrier amplifier 738. Likewise, the output of combiner 726 contains the predistorted digital signal for the peaking amplifier. This digital signal is delayed with a 90 degree phase shift by delay block 728. The output of delay block 728 is converted to an analog signal by DAC 732. The output of DAC 732 is buffered by driver 736 which drives the peaking amplifier 740.

While the same signal x(n) is desired to be transmitted using both amplifiers comprising the Doherty amplifier, each of the carrier amplifier and the peaking amplifier have different gains, and as such their inputs may be predistorted individually. By applying digital predistortion as described, DFE system 700 may compensate for the effects of the transient gate voltages and permit the DFE system 700 to transmit a signal earlier while the gate voltages are still settling, while substantially decreasing ACPR.

Figure 8:
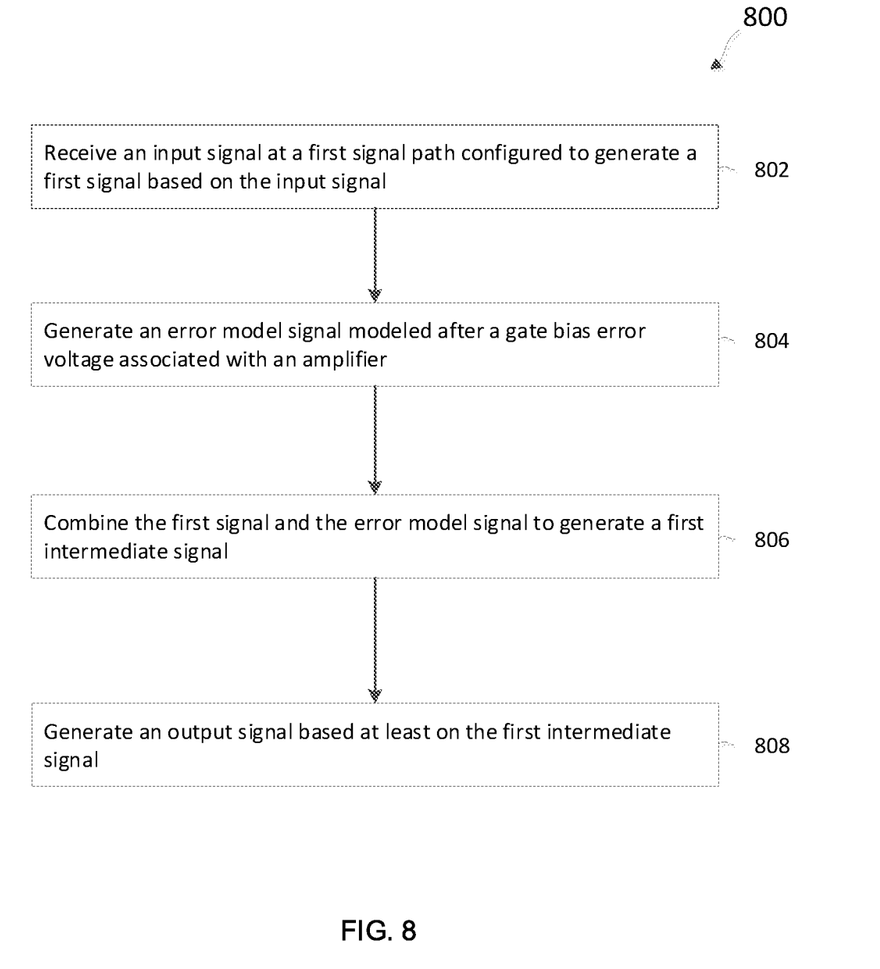
FIG. 8 is a flow diagram illustrating a method for performing a digital predistortion process in a DPD system, according to some embodiments of the present disclosure.

FIG. 8 is a flow diagram illustrating a method 800 for performing a digital predistortion process in a DPD system. Method 800 may be performed by components such as those described with reference to FIGS. 1-3 and 5-7. Blocks in method 800 may be performed in a different order than that shown. Also, some blocks may be omitted, and additional blocks may be included which are not illustrated.

At block 802, a DPD system receives an input signal at a first signal path configured to generate a first signal based on the input signal. The first signal path may include a DPD block such as the $DPD_{RLC}$ blocks discussed with reference to FIG. 5.

At block 804, the DPD system generates an error model signal modeled after a gate bias error voltage associated with an amplifier. As discussed above, multiple methods may be used to generate the error model signal. A signal may be generated directly modeled after the gate voltage signal as discussed with reference to FIG. 5. A step signal may be passed through an IIR filter and a constant gate voltage subtracted from the IIR filter output as discussed with respect to FIGS. 6-7.

At block 806, the DPD system combines the first signal and the error model signal 534 to generate a first intermediate signal 536. For example, this may be performed by a combiner such as combiner 524 in DPD system 500.

At block 808, the DPD system generates an output signal based at least on the first intermediate signal.

It is noted that various configurations (e.g., the components of the amplifier 200, the amplifier circuits 300 and 350, the DPD system 500, the IIR filter 600, and the DFE system 700) are exemplary only and not intended to be limiting beyond what is specifically recited in the claims that follow. It will be understood by those skilled in the art that other configurations may be used. Also, while an exemplary DFE system 700 is illustrated, the DPD system disclosed herein may be used to in other communication systems.

Although particular embodiments have been shown and described, it will be understood that it is not intended to limit the claimed inventions to the preferred embodiments, and it will be obvious to those skilled in the art that various changes and modifications may be made without department from the spirit and scope of the claimed inventions. The specification and drawings are, accordingly, to be regarded in an illustrative rather than restrictive sense. The claimed inventions are intended to cover alternatives, modifications, and equivalents.

What is claimed is:

1. A digital predistortion (DPD) system, comprising:
an input configured to receive an input signal;
a first signal path configured to generate a first signal based on the input signal;
an error model provider configured to generate an error model signal modeled after a gate bias error voltage associated with the DPD system, wherein the error model provider includes a time counter;
a first combiner configured to combine the first signal and the error model signal to generate a first intermediate signal; and
an output signal based at least on the first intermediate signal.

2. The DPD system of claim 1, wherein the error model signal is a decaying oscillation.

3. The DPD system of claim 1, wherein the error model signal is substantially monotonic.

4. The DPD system of claim 1, wherein a delay value is added to the time counter so that the input signal is delayed relative to the time counter.

5. The DPD system of claim 1, wherein the error model provider comprises a step signal provider coupled to an infinite impulse response (IIR) filter.

6. The DPD system of claim 1, wherein the output signal is coupled to a Doherty amplifier.

7. The DPD system of claim 1, further comprising:
a first plurality of combiners configured to generate a plurality of powers of the error model signal;
a first plurality of signal paths configured to generate a first plurality of signals based on the input signal; and
a second plurality of combiners configured to combine each of the first plurality of signals with a respective one of the plurality of powers of the error model signal to generate a first plurality of intermediate signals;
wherein the output signal is also based the first plurality of intermediate signals.

8. The DPD system of claim 7, further comprising:
a second signal path configured to generate a second signal based on the input signal;
wherein the output signal is also based on the second signal.

9. The DPD system of claim 7, wherein the first plurality of signal paths are configured to perform respective functions related to a derivative of a function associated with the first signal path.

10. A digital predistortion (DPD) system, comprising:
an input configured to receive an input signal;
a first signal path configured to generate a first signal based on the input signal;
an error model provider configured to generate an error model signal modeled after a gate bias error voltage associated with the DPD system, wherein the error model provider comprises a step signal provider coupled to an infinite impulse response (IIR) filter;
a first combiner configured to combine the first signal and the error model signal to generate a first intermediate signal; and
an output signal based at least on the first intermediate signal.

11. The DPD system of claim 10, wherein the error model signal is a decaying oscillation.

12. The DPD system of claim 10, wherein the error model signal is substantially monotonic.

13. The DPD system of claim 10, wherein the error model provider includes a time counter.

14. The DPD system of claim 13, wherein a delay value is added to the time counter so that the input signal is delayed relative to the time counter.

15. The DPD system of claim 10, wherein the output signal is coupled to a Doherty amplifier.

16. The DPD system of claim 10, further comprising:
a first plurality of combiners configured to generate a plurality of powers of the error model signal;
a first plurality of signal paths configured to generate a first plurality of signals based on the input signal; and
a second plurality of combiners configured to combine each of the first plurality of signals with a respective one of the plurality of powers of the error model signal to generate a first plurality of intermediate signals;
wherein the output signal is also based the first plurality of intermediate signals.

17. The DPD system of claim 16, further comprising:
a second signal path configured to generate a second signal based on the input signal;
wherein the output signal is also based on the second signal.

18. The DPD system of claim 16, wherein the first plurality of signal paths are configured to perform respective functions related to a derivative of a function associated with the first signal path.

19. A digital predistortion (DPD) system, comprising:
an input configured to receive an input signal;
a first signal path configured to generate a first signal based on the input signal;
an error model provider configured to generate an error model signal modeled after a gate bias error voltage of associated with the DPD system;
a first combiner configured to combine the first signal and the error model signal to generate a first intermediate signal;
an output signal based at least on the first intermediate signal;
a first plurality of combiners configured to generate a plurality of powers of the error model signal;
a first plurality of signal paths configured to generate a first plurality of signals based on the input signal; and
a second plurality of combiners configured to combine each of the first plurality of signals with a respective one of the plurality of powers of the error model signal to generate a first plurality of intermediate signals;
wherein the output signal is also based the first plurality of intermediate signals.

20. The DPD system of claim 19, wherein the error model signal is a decaying oscillation.

* * * * *